(12) United States Patent
West et al.

(10) Patent No.: US 9,754,771 B2
(45) Date of Patent: Sep. 5, 2017

(54) ENCAPSULATED MAGNETRON (71) Applicant: Applied Materials, Inc., Santa Clara, CA (US)

(72) Inventors: Brian T. West, San Jose, CA (US); Roger M. Johnson, Livermore, CA (US); Michael S. Cox, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 391 days.

(21) Appl. No.: 14/338,779

(22) Filed: Jul. 23, 2014

(65) Prior Publication Data

US 2015/0048735 A1  Feb. 19, 2015

Related U.S. Application Data

(60) Provisional application No. 61/886,027, filed on Aug. 14, 2013.

(51) Int. Cl.
| | | |
|---|---|---|
| *H01J 25/50* | (2006.01) | |
| *H01J 37/34* | (2006.01) | |
| *H01J 23/10* | (2006.01) | |
| H03B 9/10 | (2006.01) | |
| H03C 5/04 | (2006.01) | |
| H03C 3/32 | (2006.01) | |
| H01J 23/05 | (2006.01) | |
| H01J 25/587 | (2006.01) | |

(52) U.S. Cl.
CPC .......... *H01J 37/3405* (2013.01); *H01J 23/10* (2013.01); *H01J 37/345* (2013.01); *H01J 23/05* (2013.01); *H01J 25/50* (2013.01); *H01J 25/587* (2013.01); *H03B 9/10* (2013.01); *H03C 3/32* (2013.01); *H03C 5/04* (2013.01)

(58) Field of Classification Search
CPC .......... H01J 23/10; H01J 23/05; H01J 25/587; H01J 25/50; H03C 3/32; H03C 5/04; H03B 9/10
USPC ............. 315/111.21, 111.31, 111.41, 111.51, 315/39.51, 39.71; 313/160, 158
See application file for complete search history.

(56) References Cited

U.S. PATENT DOCUMENTS

| | | | | |
|---|---|---|---|---|
| 4,042,101 A | * | 8/1977 | Krammer ............. | B65G 47/261 198/781.09 |
| 5,242,566 A | * | 9/1993 | Parker .................. | H01J 37/3408 204/192.12 |
| 5,320,728 A | * | 6/1994 | Tepman .............. | H01J 37/3408 204/192.12 |
| 5,894,199 A | * | 4/1999 | Pasco .................... | H01J 25/587 315/39.55 |
| 6,228,236 B1 | | 5/2001 | Rosenstein et al. | |

(Continued)

OTHER PUBLICATIONS

PCT Notification of Transmittal of the International Search Report and the Written Opinion of the International Searching Authority for International Application No. PCT/US2014/047481 dated Nov. 27, 2014; 11 total pages.

*Primary Examiner* — Alexander H Taningco
*Assistant Examiner* — Christian L Garcia
(74) *Attorney, Agent, or Firm* — Patterson + Sheridan LLP (57) ABSTRACT

Embodiments of the present invention generally provide a magnetron that is encapsulated by a material that is tolerant of heat and water. In one embodiment, the entire magnetron is encapsulated. In another embodiment, the magnetron includes magnetic pole pieces, and the magnetic pole pieces are not covered by the encapsulating material.

14 Claims, 7 Drawing Sheets

(56) References Cited

U.S. PATENT DOCUMENTS

| | | |
|---|---|---|
| 6,440,282 B1 * | 8/2002 | Wada .................. H01J 37/3408 204/298.17 |
| 7,686,928 B2 | 3/2010 | Gung |
| 7,736,473 B2 | 6/2010 | Miller et al. |
| 7,767,064 B2 | 8/2010 | Pavloff et al. |
| 2002/0008017 A1 | 1/2002 | Fu |
| 2002/0175074 A1 | 11/2002 | Gung |
| 2005/0211548 A1 | 9/2005 | Gung et al. |
| 2008/0083610 A1 | 4/2008 | Tang et al. |
| 2011/0311735 A1 | 12/2011 | Wang et al. |

* cited by examiner

ENCAPSULATED MAGNETRON

CROSS-REFERENCE TO RELATED APPLICATIONS

This application claims priority to U.S. Provisional Patent Application Ser. No. 61/866,027, filed on Aug. 14, 2013, which herein is incorporated by reference.

BACKGROUND

Field

Embodiments described herein generally relate to magnetrons used in physical vapor deposition process. In particular, embodiments described herein relate to an encapsulated magnetron.

Description of the Related Art

Physical vapor deposition (PVD), alternatively called sputtering, is a method of depositing layers of metals and related materials in the fabrication of integrated circuits. PVD was developed to deposit planar metal layers used for interconnects. Commercial PVD typically utilizes a plasma of a sputter working gas, such as argon, to bombard the negatively biased target with argon ions to sputter atoms of the target material, which thereafter coat a substrate with a layer of the target material. Plasma discharges are typically formed in the process chamber by DC or RF voltages, microwaves, planar magnetrons, or a combination of techniques.

A planar magnetron system typically uses a rotating magnetron disposed above a target and either a DC bias between the target and the substrate and/or an RF source coupled into the space between the target and substrate to form the plasma. The magnetron is a magnet assembly that provides magnetic field lines near the sputtering surface of the target. A negative bias voltage between the target and the plasma region accelerates the ions toward the target to dislodge the target material therefrom. The magnetic field from the magnetron confines the free electrons, including secondary electrons displaced from the target material, near the target to maximize the ionizing collisions by the free electrons with the sputtered material. The magnetron typically includes one or more magnets, which rotate around the backside, i.e., non-sputtered surface, of the target to evenly spread the magnetic field around the surface of the target to result in more uniform sputtering of the target material.

The plasma used in the PVD process may heat up the target. If the magnetron and/or the target are heated above a designated process temperature, then the high temperature may after the performance of the process by changing the sputtering rate or sputtering uniformity on the target and lessening the useful lives of the magnetron and the target. Conventionally, targets are cooled by having the backside exposed to a cooling fluid, such as deionized water, which is housed in the magnetron cavity. The magnetron is disposed in the magnetron cavity and the magnets and support structures may be corroded by the heat and the cooling. In addition, handling the magnetrons can be problematic with the open structures and can lead to hardware handling problems as dropped hardware can become lodged in the internal structure of the magnets and is difficult to remove.

Therefore, an improved magnetron is needed.

SUMMARY

Embodiments described herein generally provide a magnetron that is encapsulated by a material that is tolerant of heat and water. In one embodiment, the entire magnetron is encapsulated. In another embodiment, the magnetron includes magnetic pole pieces, and the magnetic pole pieces are not covered by the encapsulating material.

In one embodiment, a magnetron is disclosed. The magnetron includes a plurality of magnets, wherein each of the plurality of magnets has a first end and a second end, a first magnetic pole piece, wherein the first magnetic pole piece is coupled to the first end of the magnets, a second magnetic pole piece, wherein the second magnetic pole piece is coupled to the second end of the magnets, and an encapsulating material covering the plurality of magnets.

In another embodiment, a magnetron is disclosed. The magnetron includes a plurality of magnets, where each of the plurality of magnets has a first end and a second end. The magnetron further includes a backing plate, and the backing plate is coupled to the first end of the magnets. The magnetron further includes a first magnetic pole piece, and the first magnetic pole piece is coupled to the second end of the magnets. The magnetron further includes a first encapsulating material covering the plurality of magnets.

In another embodiment, a magnetron is disclosed. The magnetron includes a backing plate, a first magnetic pole piece, a second magnetic pole piece, a plurality of magnets disposed between the backing plate and the first magnetic pole piece, and a first encapsulating material covering the plurality of magnets.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
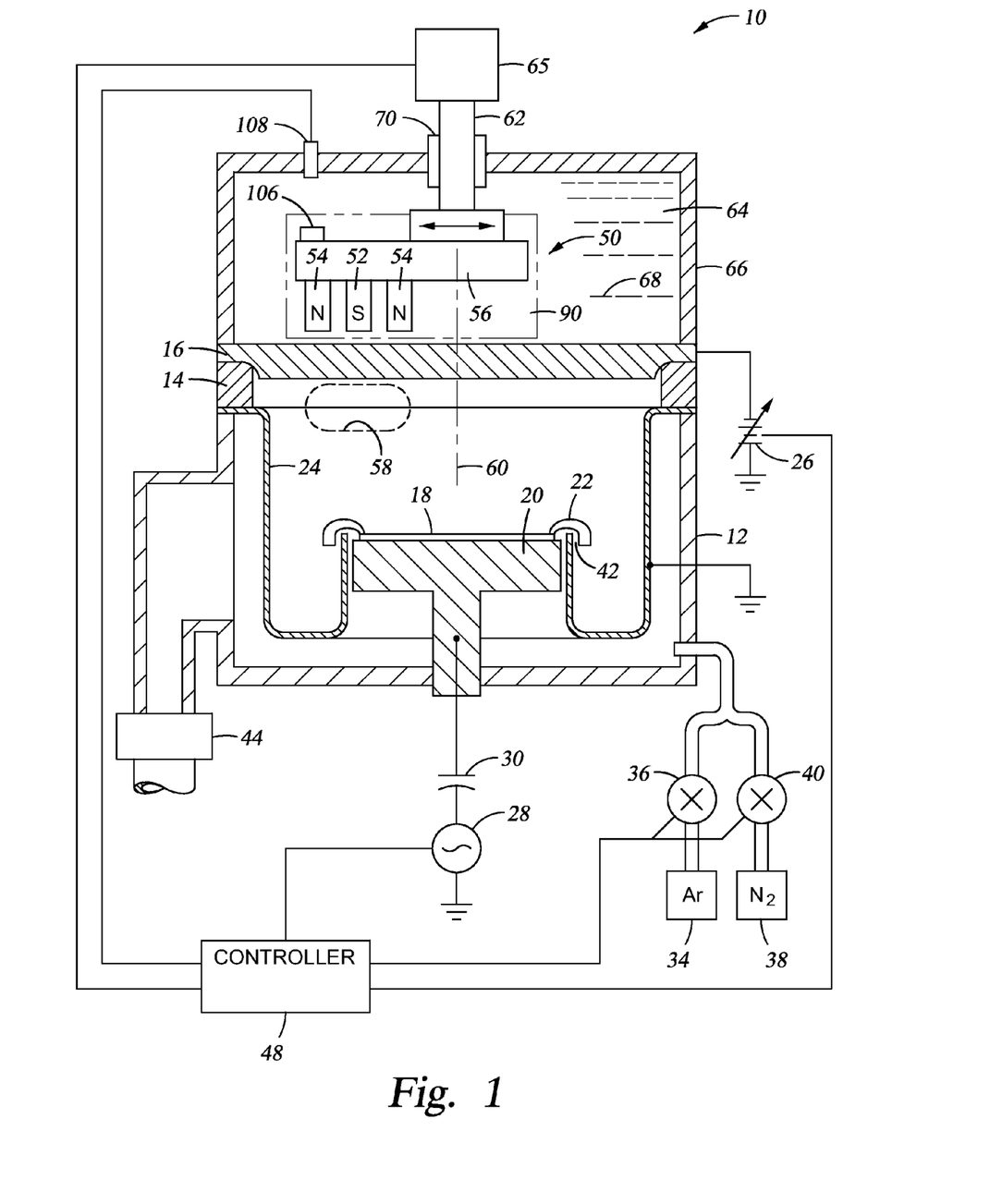
FIG. 1 is a cross sectional view of a PVD chamber according to one embodiment.

Embodiments described herein generally provide a magnetron that is encapsulated by a material that is tolerant of heat and water. FIG. 1 is a cross sectional view of a PVD chamber 10 according to one embodiment. The chamber 10 includes a vacuum chamber body 12 sealed through a ceramic insulator 14 to a sputtering target 16 having at least a front face composed of a material, usually a metal, to be sputter deposited on a wafer 18 held on a heater pedestal electrode 20 by a wafer clamp 22. Alternatively to the wafer clamp 22, a cover ring or an electrostatic chuck may be incorporated into the pedestal 20 or the wafer may be placed on the pedestal 20 without being held in place. The target material may be aluminum, copper, titanium, tantalum, cobalt, nickel, molybdenum, alloys of these metals containing less than 10 wt % of an alloying element, or other metals and metal alloys amenable to DC sputtering. On the other hand, RF sputtering may be used to sputter material from a dielectric target.

A grounded shield 24 held within the chamber body 12 protects the chamber wall 12 from the sputtered material and provides a grounded anode. An additional floating shield may be used. An RF power supply 28 may be coupled to the pedestal electrode 20 through an AC capacitive coupling circuit 30 to allow the pedestal electrode 20 to develop a DC self-bias voltage in the presence of a plasma. A negative DC self-bias attracts positively charged sputter ions created in a high-density plasma deeply into a high aspect-ratio holes characteristic of advanced integrated circuits.

A first gas source 34 supplies a sputtering working gas, such as argon, to the chamber body 12 through a mass flow controller 36. In reactive metallic nitride sputtering, for example, of titanium nitride or tantalum nitride, nitrogen is additionally supplied into the chamber from another gas source 38 through another mass flow controller 40. Oxygen can alternatively be supplied to produce oxides such as $Al_2O_3$. The gases can be admitted from various positions within the chamber body 12. For example, one or more inlet pipes located near the bottom of the chamber body 12 supply gas at the back of the shield 24. The gas penetrates through an aperture at the bottom of the shield 24 or through a gap 42 formed between the cover ring 22 and the shield 24 and the pedestal electrode 20. A vacuum pumping system 44 connected to the chamber body 12 through a wide pumping port maintains the interior of the chamber body 12 at a low pressure. A computer based controller 48 controls the reactor including the power supplies 26, 28 and the mass flow controllers 36, 40.

To provide efficient sputtering, a magnetron 50 is disposed in a magnetron cavity 64 above the target 16. The magnetron 50 may include a plurality of opposed magnets 52, 54 coupled by a backing plate 56 to produce a magnetic field within the chamber body 12 in the neighborhood of the plurality of magnets 52, 54. The magnetron 50 is small, nested, and unbalanced with one or more inner magnets 52 surrounded by opposed outer magnets 54 of greater magnetic intensity. An inner magnet 52 and an outer magnet 54 may be replaced with a U shaped magnet. In one embodiment, the magnetron 50 includes a plurality of U shaped magnets. The magnetic field traps electrons and, for charge neutrality, the ion density also increases to form a high density plasma region 58 within the chamber body 12 adjacent to the magnetron 50. To achieve uniform sputtering onto the wafer 18, the magnetron 50 is usually rotated about the center 60 of the target 16 by a shaft 62 driven by a motor 65.

To counteract the large amount of power delivered to the target, the back of the target 16 may be sealed to a backside coolant chamber 66. Coolant such as chilled deionized water 68 is circulated through the interior of the coolant chamber 66 to cool the target 16. The magnetron 50 is immersed in the cooling water 68, and the target rotation shaft 62 passes through the coolant chamber 66 through a rotary seal 70. Because of the heat generated in the target 16 and the coolant such as the deionized water 68, the magnetron 50 may be corroded. To prevent the corrosion of the magnetron 50, the magnetron 50 may be encapsulated by an encapsulating material 90. In one embodiment, multiple magnetrons may be disposed in the magnetron cavity 64. The magnetrons may be individually encapsulated, or the magnetrons are encapsulated together.

The encapsulating material 90 may be any material that is tolerant of heat and water, such as epoxy, urethanes, rubber, or the like. In one embodiment, the encapsulating material 90 includes two part epoxy. The encapsulating material 90 may be opaque or transparent and may be black or other colors. The encapsulating material 90 may cover the entire magnetron 50, as shown in FIG. 1. Alternatively, a portion of the magnetron 50 that is facing the target 16 may be exposed.

A positional flag 106, such as a magnet, may be fixed to the backing plate 56, and a position sensor 108, such as a magnetic Hall sensor, may be disposed over the magnetron 50 to allow the controller 48 to determine the current radial position of the magnetron 50 as the rotating magnets 52, 54 either do or do not pass beneath the position sensor 108.

Figure 2A:
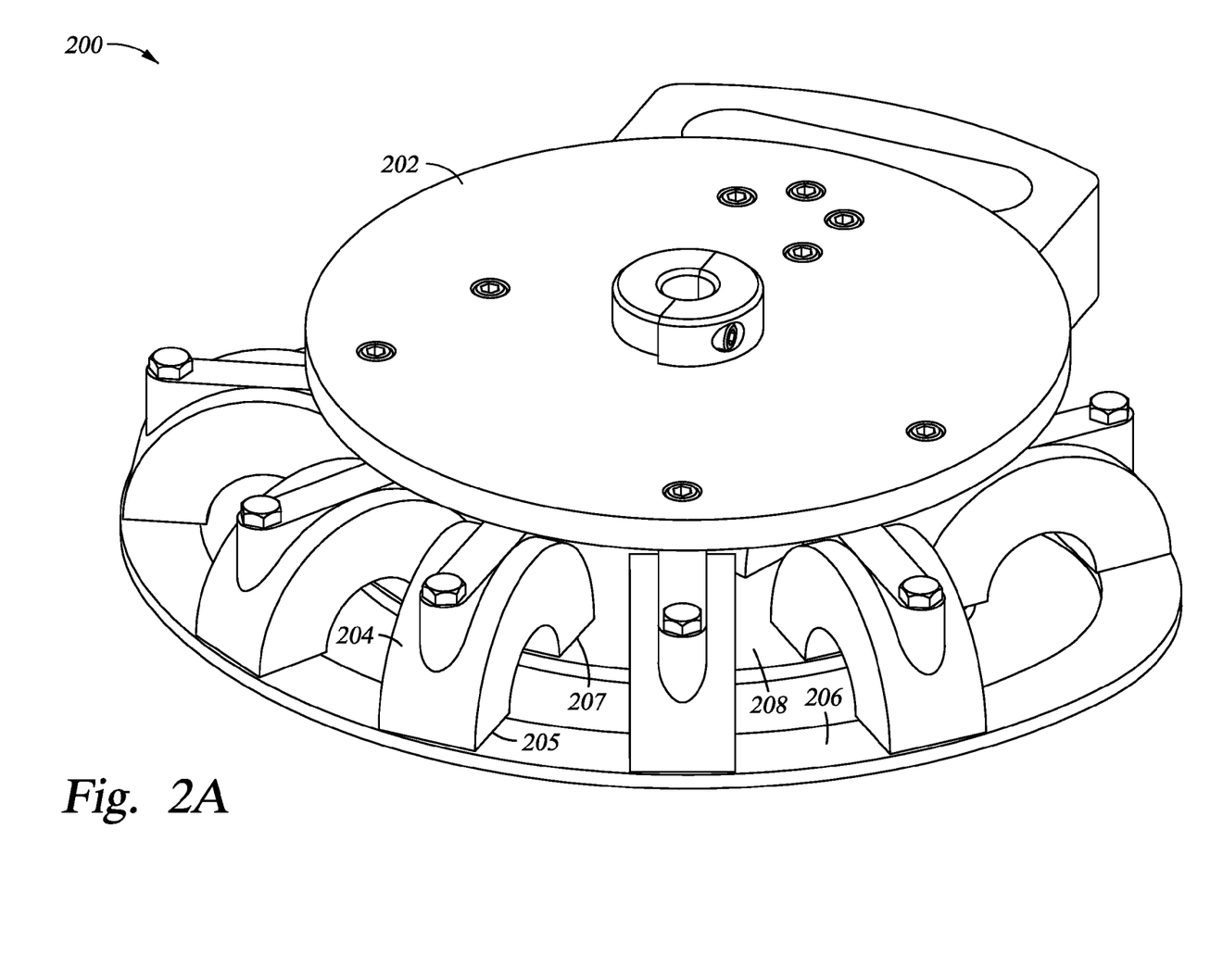
FIGS. 2A-2C are orthographic views of a magnetron according to one embodiment.
Figure 2B:
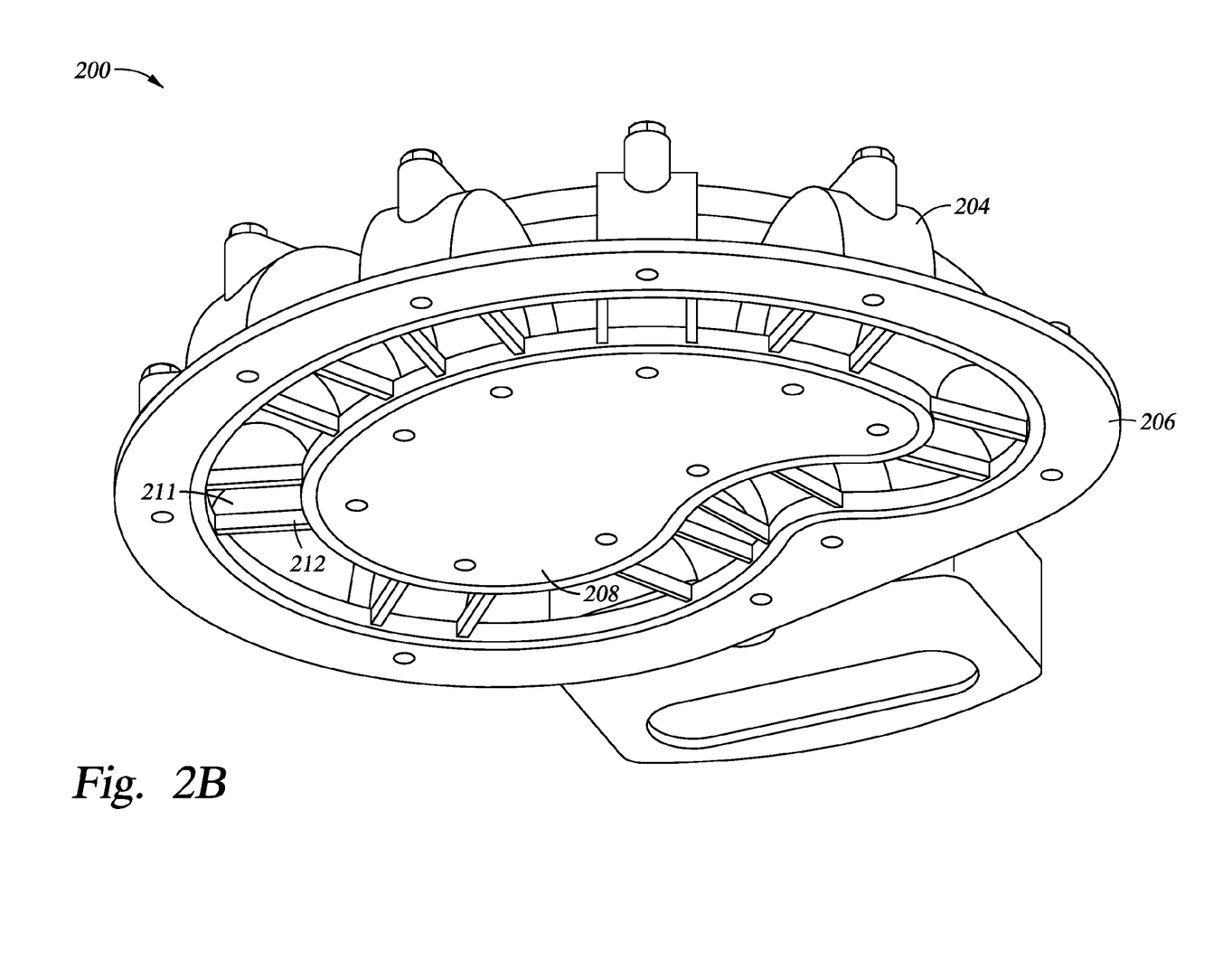
Figure 2C:
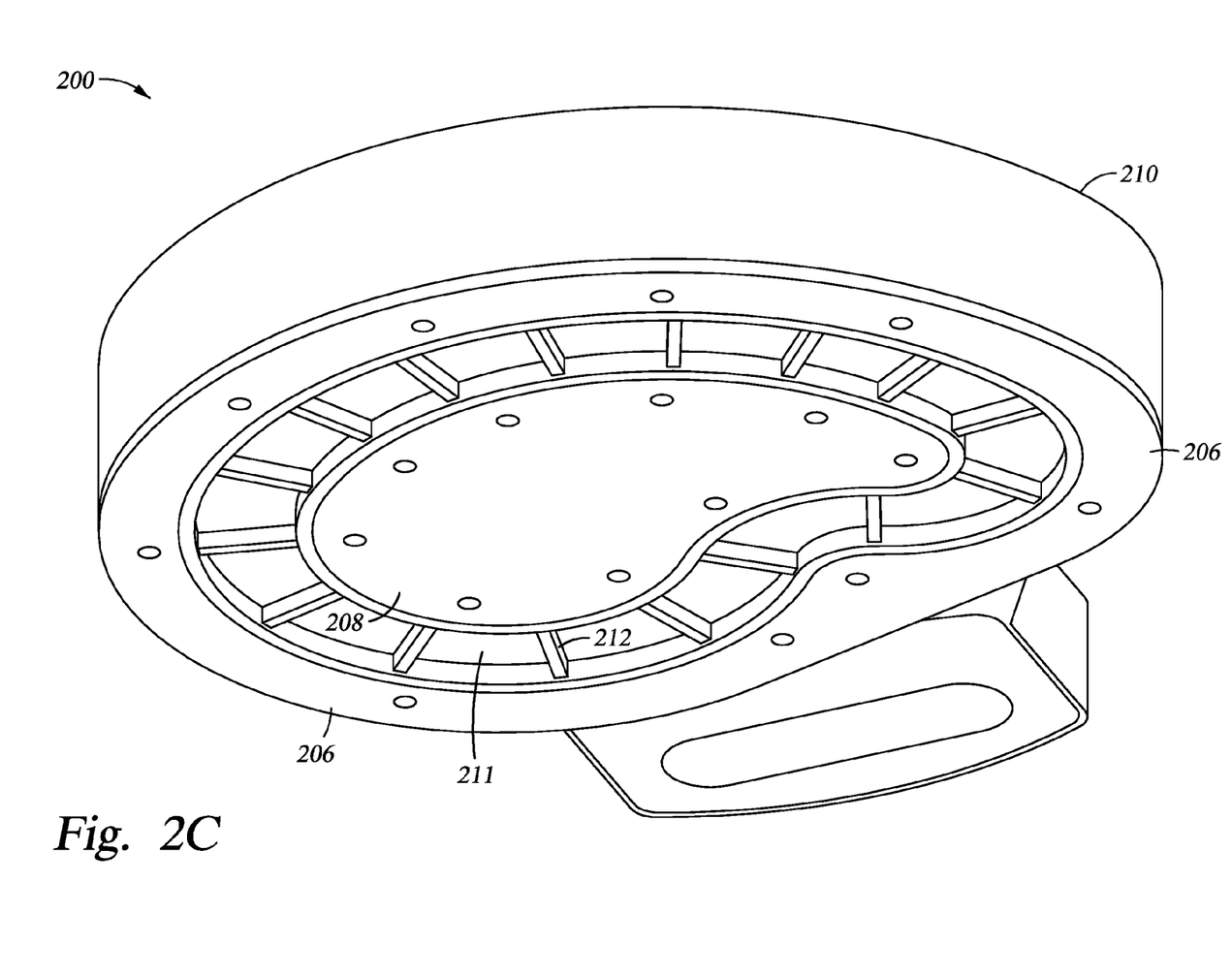

FIGS. 2A-2C are orthographic views of a magnetron 200 according to one embodiment. The magnetron 200 may be the magnetron 50 described in FIG. 1. The magnetron 200 includes a backing plate 202, a plurality of U shaped magnets 204, a first magnetic pole piece 206 and a second magnetic pole piece 208. The backing plate 202 may be made of brass, and the magnetic pole pieces 206, 208 may be made of stainless steel. The plurality of magnets 204 may be disposed between the backing plate 202 and the first and second magnetic pole pieces 206, 208. The first magnetic pole piece 206 may be a loop, and one end 205 of each of the U magnets 204 is disposed thereon. The second magnetic pole piece 208 may be a plate, and the other end 207 of each of the U magnets 204 is disposed thereon. The second magnetic pole piece 208 may be surrounded by the first magnetic pole piece 206. The first and second magnetic pole pieces 206, 208 may be coplanar. Because of the distance between the magnetic pole pieces 206, 208 and the back of the target 16 is very small, for example around 1 mm, the magnetic pole pieces 206, 208 may not be covered by an encapsulating material. The top and the side of the magnetron 200 are covered by the encapsulating material (not shown).

As shown in FIG. 2B, the magnetic pole pieces 206, 208 are not covered by the encapsulating material. A gap between the magnetic pole pieces 206, 208 may be covered by an encapsulating material (not shown), which may be made of the same material as the encapsulating material covering the top and the side of the magnetron 200. FIG. 2C illustrates the magnetron 200 covered by encapsulating materials 210, 211. The encapsulating materials 210, 211 may be made of opaque material. In one embodiment, the encapsulating materials 210, 211 are made of a black opaque material. As shown in FIG. 2C, the magnetic pole pieces 206, 208 are not covered by the encapsulating materials 210, 211. The gap between the magnetic pole pieces 206, 208 is covered by the encapsulating material 211, and the encapsulating material 211 is not coplanar with the magnetic pole pieces 206, 208. The encapsulating material 211 is recessed from the plane that the magnetic pole pieces 206, 208 are disposed thereon. The plurality of ridges 212 may be disposed on the encapsulating material 211. The plurality of ridges 212 may be made of the same material as the encapsulating materials 210, 211. The recessed encapsulating material 211 and the plurality of ridges 212 increase cooling fluid turbulence and improve the cooling of the target 16, as the magnetron 200 is rotated inside the coolant chamber 66 which is filled with the coolant 68.

Figure 3A:
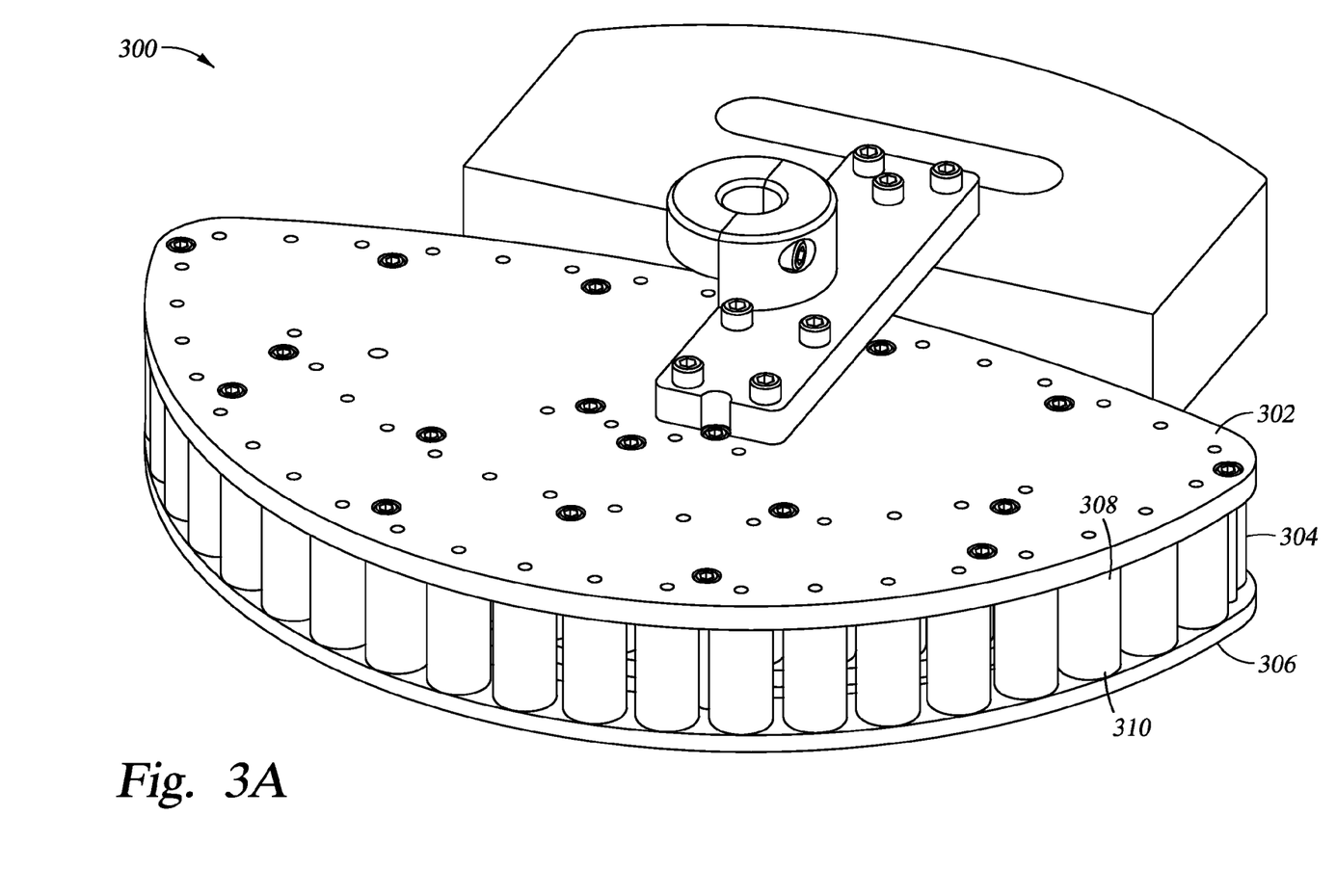
FIGS. 3A-3C illustrate a magnetron according to one embodiment.

FIG. 3A is a perspective view of a magnetron 300 according to one embodiment. The magnetron 300 has a backing plate 302, a first magnetic pole piece 306, and a plurality of magnets 304 disposed between the backing plate 302 and the first magnetic pole piece 306. The magnets 304 may be cylindrical, as shown in FIG. 3A. The magnets 304 each has a first end 308 and a second end 310. The first end 308 is coupled to the backing plate 302 and the second end 310 is coupled to the first magnetic pole piece 306. A second magnetic pole piece (not shown) may be coplanar with the first magnetic pole piece and may be surrounded by the first magnetic pole piece 306. A plurality of magnets (not shown) may be disposed between the backing plate 302 and the second magnetic pole piece.

Figure 3B:
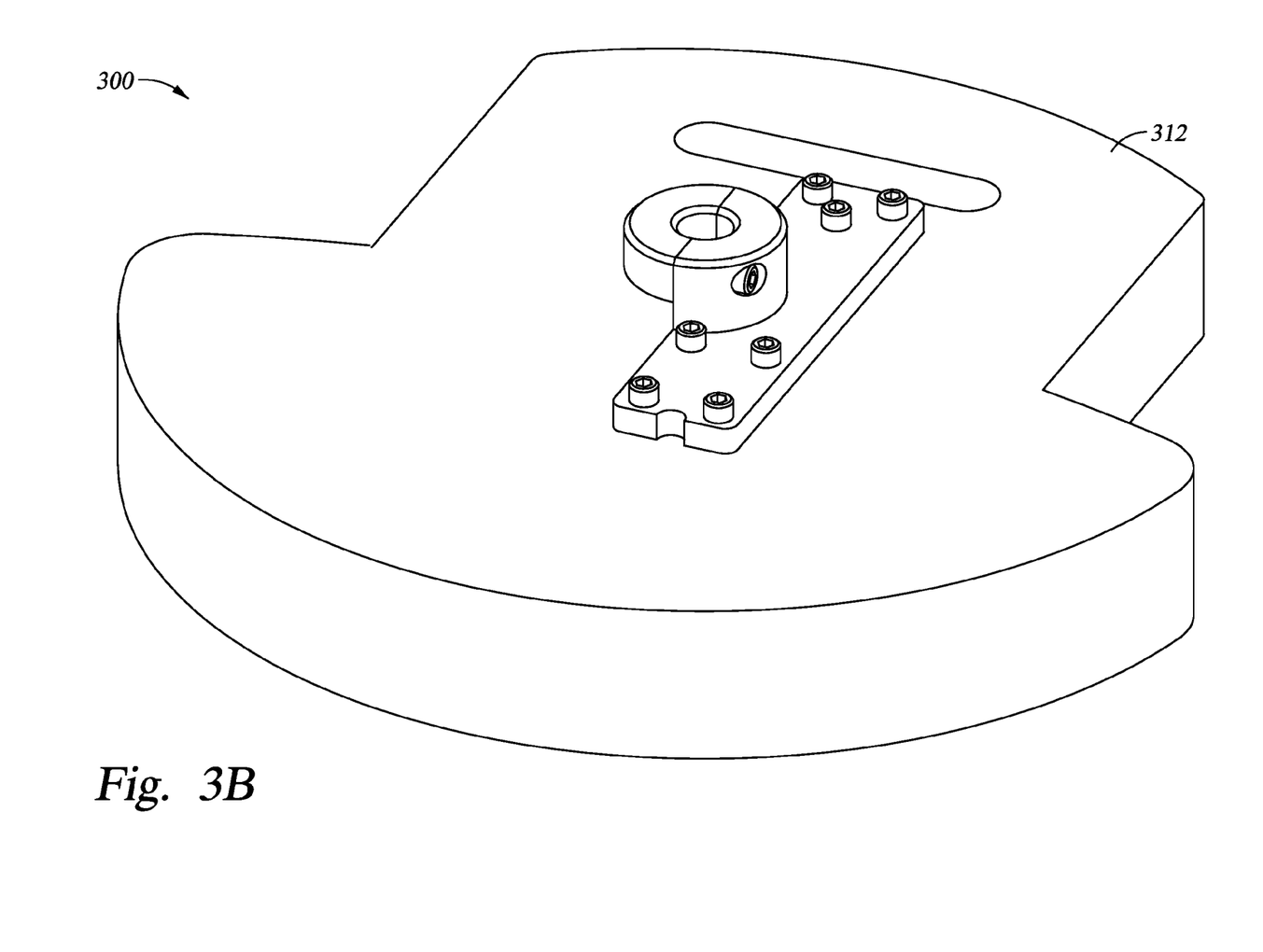
Figure 3C:
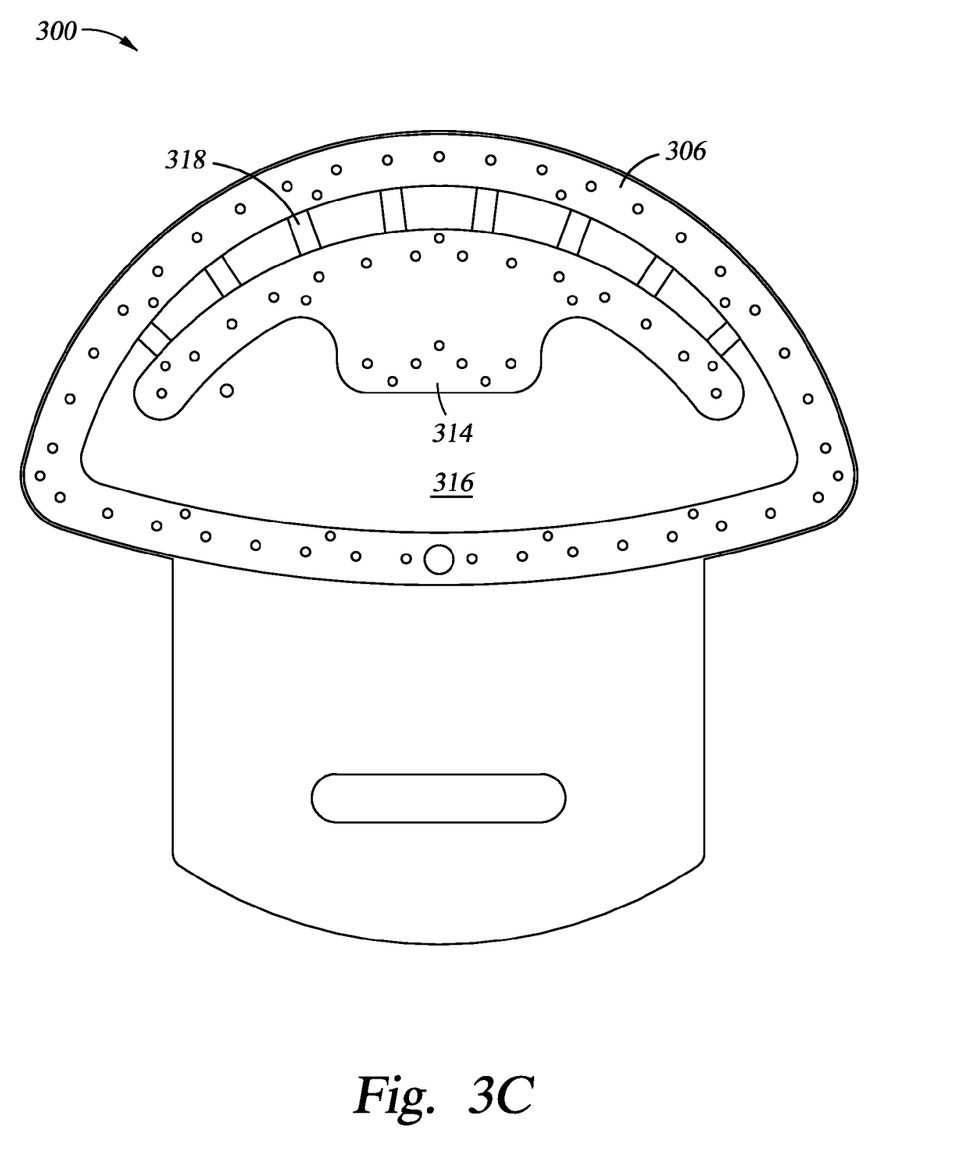

FIG. 3B is a perspective view of the magnetron 300 according to one embodiment. As shown in FIG. 3B, the magnetron 300 is encapsulated with an encapsulating material 312. The encapsulating material 312 may be made of the same material as the encapsulating material 210. The encapsulating material 312 may cover the top and side of the magnets 304. FIG. 3C is a bottom view of the magnetron 300 according to one embodiment. As shown in FIG. 3C, the magnetron 300 includes a second magnetic pole piece 314 that is surrounded by the first magnetic pole piece 306, and a second encapsulating material 316 covers the gap between the first magnetic pole piece 306 and the second magnetic pole piece 314. A plurality of magnets (not shown) may be disposed between the second magnetic pole piece 314 and the backing plate 302. The first magnetic pole piece 302 and the second magnetic pole piece 314 may be coplanar, and the second encapsulating material 316 may be recessed from the plane the first and second magnetic pole pieces 302, 314 are disposed thereon. A plurality of ridges 318 may be formed on the second encapsulating material 316. The plurality of ridges 318 may be made of the same material as the encapsulating materials 312, 316. The recessed second encapsulating material 316 and the plurality of ridges 318 increase cooling fluid turbulence and improve the cooling of the target 16, as the magnetron 300 is rotated inside the coolant chamber 66 which is filled with the coolant 68.

An encapsulated magnetron may be used to assist PVD process. The encapsulated magnetron may be rotated in a coolant during the PVD process. Because the encapsulating material is tolerant of heat and water, the magnetron is protected by the encapsulating material from getting corroded.

For any of the magnetron sections that are rigid the assembly can be molded or potted in an encapsulant. The molded part must fit within the cavity in the source assembly such that free rotation is possible. The encapsulation process involves making a mold to fit the assembly into and then pouring, injection or compressing the encapsulating material into the assembly to generate a fully or partially encased structure. The encapsulant may be appropriate for the environment on the source but might be made of a 2 part epoxy, resin or elastomer, a heat melt plastic or elastomer or a heat cure material. The material is preferable opaque. The material can optionally be filled with a filler material to adjust density, structural or cost properties. Fillers might include fibers (glass, aramid, carbon etc.) or a powder (glass, talc etc) or microballoons or equivalent. If needed channels can be molded into the encapsulant—or machined in later to allow for water flow through the body. In addition features can be molded or machined into the surface to enhance water circulation.

The encapsulated magnetron offers the advantages of reducing or eliminating corrosion, channeling cooling fluid flow as desired and improving handling and safety through the elimination of the multiple cavities in the open assembly that can attract/capture tools and hardware.

While the foregoing is directed to embodiments of the present invention, other and further embodiments of the invention may be devised without departing from the basic scope thereof, and the scope thereof is determined by the claims that follow.

The invention claimed is:

1. A magnetron, comprising:
   a plurality of magnets, wherein each magnet of the plurality of magnets has a first end and a second end;
   a first magnetic pole piece, wherein the first magnetic pole piece is coupled to each first end of each magnet;
   a second magnetic pole piece, wherein the second magnetic pole piece is coupled to each second end of each magnet;
   a first encapsulating material covering the plurality of magnets;
   a second encapsulating material disposed in a gap between the first magnetic pole piece and the second magnetic pole piece; and
   a plurality of ridges disposed on the second encapsulating material.

2. The magnetron of claim 1, wherein the first encapsulating material is coupled to the first magnetic pole piece.

3. The magnetron of claim 1, wherein the first encapsulating material is selected from at least one of epoxies, urethanes, and rubber.

4. The magnetron of claim 1, wherein the second magnetic pole piece is surrounded by the first magnetic pole piece.

5. The magnetron of claim 1, wherein the second encapsulating material comprises a same material as the first encapsulating material.

6. The magnetron of claim 1, wherein the plurality of ridges are made of a same material as the first encapsulating material.

7. A magnetron, comprising:
   a plurality of magnets, wherein each magnet of the plurality of magnets has a first end and a second end;
   a backing plate, wherein the backing plate is coupled to each first end of each magnet;
   a first magnetic pole piece, wherein the first magnetic pole piece is coupled to each second end of each magnet;
   a first encapsulating material covering the plurality of magnets;
   a second encapsulating material disposed in a gap between the first magnetic pole piece and a second magnetic pole piece; and
   a plurality of ridges disposed on the second encapsulating material.

8. The magnetron of claim 7, wherein the first encapsulating material is selected from at least one of epoxies, urethanes, and rubber.

9. The magnetron of claim 7, further comprising a second magnetic pole piece, wherein the second magnetic pole piece is surrounded by the first magnetic pole piece.

10. The magnetron of claim 9, wherein the first magnetic pole piece and the second magnetic pole piece are coplanar.

11. The magnetron of claim 7, wherein the second encapsulating material comprises a same material as the first encapsulating material.

12. The magnetron of claim 7, wherein the plurality of ridges comprises a same material as the first encapsulation material.

13. A magnetron, comprising:
    a backing plate;
    a first magnetic pole piece;
    a second magnetic pole piece;

a plurality of magnets disposed between the backing plate and the first magnetic pole piece;
a first encapsulating material covering the plurality of magnets;
a second encapsulating material disposed in a gap between the first magnetic pole piece and the second magnetic pole piece; and
a plurality of ridges disposed on the second encapsulating material.

14. The magnetron of claim 13, wherein the second magnetic pole piece is surrounded by the first magnetic pole piece, and the first and second magnetic pole pieces are coplanar.

* * * * *

UNITED STATES PATENT AND TRADEMARK OFFICE
CERTIFICATE OF CORRECTION

PATENT NO. : 9,754,771 B2  
APPLICATION NO. : 14/338779  
DATED : September 5, 2017  
INVENTOR(S) : Brian T. West et al.

Page 1 of 1

It is certified that error appears in the above-identified patent and that said Letters Patent is hereby corrected as shown below:

On the Title Page

In item (60), in Column 1, in "Related U.S. Application Data", Line 1, delete "61/886,027," and insert -- 61/866,027, --, therefor.

In the Specification

In Column 1, Line 50, delete "after" and insert -- alter --, therefor.

Signed and Sealed this  
Seventh Day of November, 2017

Joseph Matal  
*Performing the Functions and Duties of the*  
*Under Secretary of Commerce for Intellectual Property and*  
*Director of the United States Patent and Trademark Office*